(12) United States Patent
Raberg

(10) Patent No.: US 11,335,851 B2
(45) Date of Patent: May 17, 2022

(54) METHODS AND APPARATUSES FOR PRODUCING MAGNETORESISTIVE APPARATUSES

(71) Applicant: Infineon Technologies AG, Neubiberg (DE)

(72) Inventor: Wolfgang Raberg, Sauerlach (DE)

(73) Assignee: Infineon Technologies AG

( * ) Notice: Subject to any disclaimer, the term of this patent is extended or adjusted under 35 U.S.C. 154(b) by 159 days.

(21) Appl. No.: 16/823,641

(22) Filed: Mar. 19, 2020

(65) Prior Publication Data
US 2020/0220075 A1    Jul. 9, 2020

Related U.S. Application Data

(62) Division of application No. 15/593,504, filed on May 12, 2017, now Pat. No. 10,665,778.

(30) Foreign Application Priority Data

May 17, 2016  (DE) ................... 10 2016 109 019.0

(51) Int. Cl.
*H01L 43/12* (2006.01)
*G01R 33/00* (2006.01)
*G01R 33/09* (2006.01)
*H01L 43/08* (2006.01)

(52) U.S. Cl.
CPC .......... *H01L 43/12* (2013.01); *G01R 33/0052* (2013.01); *G01R 33/09* (2013.01); *H01L 43/08* (2013.01)

(58) Field of Classification Search
None
See application file for complete search history.

(56) References Cited

U.S. PATENT DOCUMENTS

2012/0306490 A1* 12/2012 Furuichi ............. G01R 33/098
324/252

* cited by examiner

*Primary Examiner* — Bo B Jang
(74) *Attorney, Agent, or Firm* — Design IP

(57) ABSTRACT

Methods and apparatuses for producing magnetoresistive apparatuses are provided. Here, structures are formed for defining regions of the same magnetization, magnets are magnetized, and structures are formed within the magnets of the regions, for example, in order to define magnetoresistive elements.

15 Claims, 4 Drawing Sheets

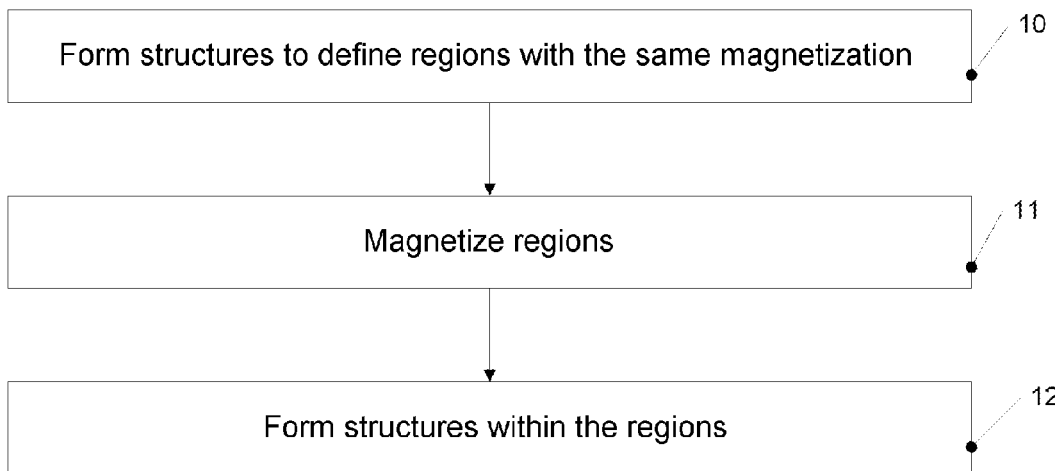
Fig. 1
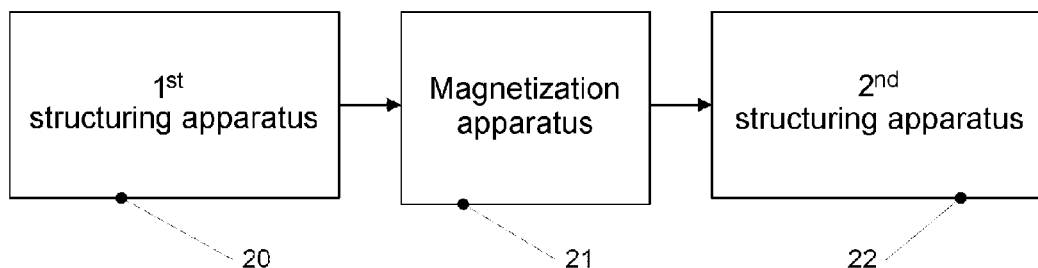
Fig. 2
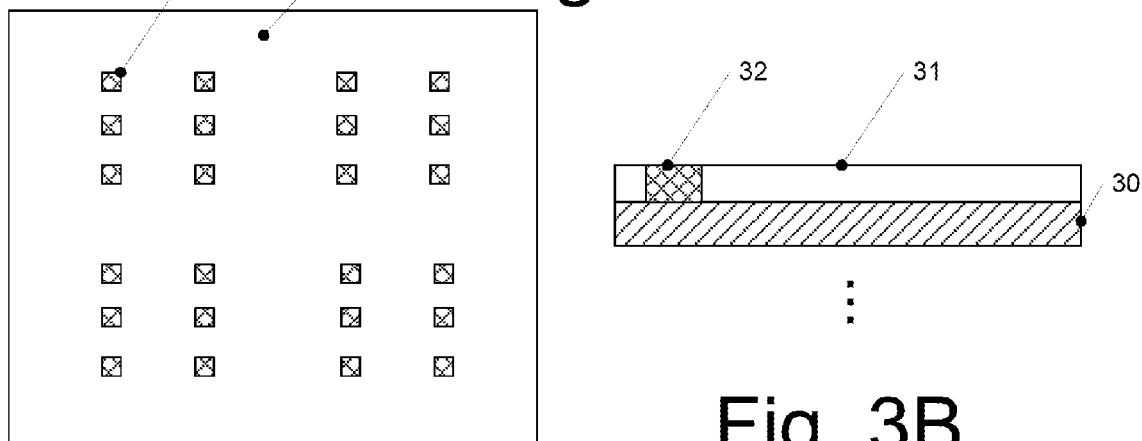
Fig. 3A
Fig. 3B

METHODS AND APPARATUSES FOR PRODUCING MAGNETORESISTIVE APPARATUSES

CROSS-REFERENCE TO RELATED APPLICATIONS

This application is a divisional of U.S. patent application Ser. No. 15/593,504 filed May 12, 2017, which claims the benefit of German Patent Application No. 10 2016 109 019.0 filed May 17, 2016, which are incorporated by reference as if fully set forth.

FIELD

The present application relates to methods and apparatuses for producing magnetoresistive apparatuses (e.g., component parts or components) and correspondingly to the produced magnetoresistive apparatuses.

BACKGROUND

Magnetoresistive apparatuses use magnetoresistive effects, in which a resistance changes depending on a magnetic field. Examples of such magnetoresistive effects are giant magnetoresistance (GMR), tunneling magnetoresistance (TMR), anisotropic magnetoresistance (AMR) or colossal magnetoresistance (CMR). Bracketed together, these effects are also referred to as xMR. Therefore, magnetoresistive apparatuses may be used, in general, for measuring magnetic fields.

By way of example, such magnetoresistive apparatuses are used in speed, angle or rotational speed measuring apparatuses, in which magnets are moved relative to a magnetoresistive apparatus and hence the magnetic field at the location of the magnetoresistive apparatus changes in the case of movement, which, in turn, leads to a measurable change in resistance. By way of example, for the purposes of an angle sensor, a magnet or a magnet arrangement may be applied to a rotatable shaft and a magnetoresistive apparatus may be arranged stationary in relation thereto.

Magnetoresistive sensor elements of such magnetoresistive apparatuses typically comprise a plurality of layers, of which at least one layer is a reference layer with a reference magnetization. In some applications, a magnetoresistive apparatus in the process comprises a plurality of magnetoresistive sensor elements, which have different reference magnetizations. By way of example, such different reference magnetizations may be achieved by means of a laser magnetization. To this end, a region to be magnetized is exposed to a magnetic field corresponding to the desired magnetization, and a region to be magnetized is then heated by means of a laser beam. In this case, examples of such applications, in which various reference magnetizations are required, are angle sensors, compass sensors or specific types of speed sensors (for example, speed sensors in a bridge arrangement referred to as monocells).

Particularly in the case of small structures, the resulting magnetization in the case of laser magnetization is low when compared with a homogeneous magnetization process in a furnace; this is reflected in lower signal levels of a correspondingly implemented magnetic field sensor. Here, the lower magnetization may be caused, for example, by deflection of the laser beam at small structures, for example oblique structure flanks and the like. Here, this problem increases with decreasing structure dimensions, and so only insufficient magnetizations may be obtained for, in particular, small structure dimensions in sensor structures. On the other hand, samples can only be magnetized completely homogeneously in such a furnace, and different reference magnetizations in different regions on a substrate are not possible.

Therefore, it may be desirable to provide improved options for producing magnetoresistive apparatuses which comprise sensor elements with different reference magnetizations.

SUMMARY

A method as claimed in claim 1 and an apparatus as claimed in claim 14 are provided. The dependent claims define further embodiments and a magnetoresistive apparatus produced by means of the method.

BRIEF DESCRIPTION OF THE DRAWINGS

FIG. 1 is a flowchart illustrating a method in accordance with one or more embodiments;

FIG. 2 is a block diagram of an apparatus in accordance with one or more embodiments;

FIGS. 3A-3B are schematic views of structures for exemplifying at least part of the method of FIG. 1 and the method of operation of the apparatus of FIG. 2;

DETAILED DESCRIPTION

Figure 4A:
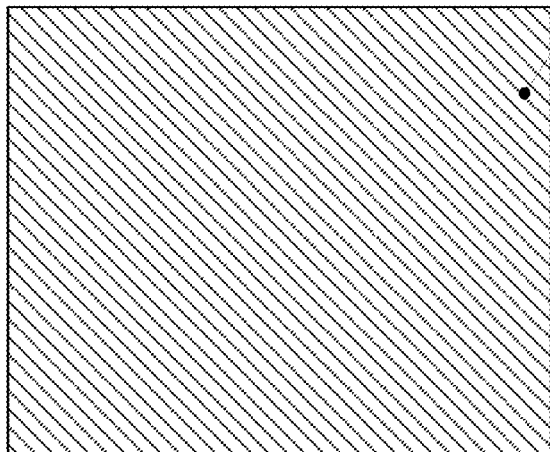
FIGS. 4A-4B are schematic views of structures for exemplifying at least part of the method of FIG. 1 and the method of operation of the apparatus of FIG. 2.

Various embodiments are explained in detail below. These embodiments only serve for exemplification purposes and should not be construed as being restrictive. By way of example, a description of an embodiment with a multiplicity of components, features or details should not be construed to the effect that all of these components, features or details are necessary for implementation purposes. Rather, such features, components or details may be replaced in other embodiments by alternative features, components or details, or they may also be omitted.

Moreover, further features or components, for example features or components used conventionally for producing magnetoresistive apparatuses (xMR apparatuses), may also be present in addition to the explicitly described features or components of the example embodiments.

FIG. 1 depicts a method in accordance with an embodiment in the form of a flowchart. The method of FIG. 1 may be implemented as part of a production process for producing magnetoresistive apparatuses. Here, further procedures or processing steps may be carried out before and after the procedures described in detail below, for example procedures and processes conventionally used for producing such apparatuses. In particular, the explicitly illustrated steps in this case relate to the magnetization, for example of a reference layer, in xMR structures. By way of example, semiconductor components may be formed in a semiconductor wafer and contacted by metal layers before the depicted steps, and xMR components may then be formed as further layers in such processing. After the illustrated steps, it is possible to carry out steps such as installation into a housing, electrical contacting by means of bond wires and the like. In other words, FIG. 1 is used to explain those processing procedures, in particular, which distinguish the example embodiment in FIG. 1 from conventional production methods for magnetoresistive apparatuses.

The method of the FIG. 1 starts with a substrate, for example a semiconductor wafer, on which one or more layers were deposited for forming magnetoresistive structures. By way of example, three layers may be deposited for forming TMR structures, a first layer serving as a reference layer, a second layer in which a resistance is subsequently measured, and a third layer which serves as a free layer. In a TMR element, the second layer is non-conductive and a current flow is produced by a spin-dependent tunneling effect. The second layer is electrically conductive in the case of GMR elements. Any materials which are used for conventional magnetoresistive elements may be used as materials for such layers, in particular e.g. two layers of ferromagnetic materials which are separated by a nonmagnetic electrically conductive layer. Other layer structures may also be used in other xMR structures. Examples of materials for the first layer and the third layer are ferromagnetic materials, such as e.g. Co, Fe, Ni, and alloys of these materials among themselves and with further elements such as e.g. B, N, Hf, O, or Si. The first layer may also have additional adjacent layers for e.g. improving the magnetic properties or the structure, made of e.g. Ru, Cu or similar materials in order to form a synthetic antiferromagnet in combination with a further ferromagnetic layer, or/and a natural antiferromagnet (e.g. PtMn, IrMn, NiMn, FeMn, or the like) for the purposes of stabilizing the magnetization. MgO, aluminum oxide, hafnium oxide are examples of materials for the second layer in TMR layer stacks. Cu, Cr and Ag are examples of materials for the second layer in GMR layer stacks.

At 10, structures are formed on the substrate, said structures defining regions which are intended to obtain the same magnetization of e.g. a reference layer. These structures may, in particular, be relatively large, for example have smallest dimensions in one direction of greater than 10 µm, greater than 20 µm, greater than 50 µm, or greater than 100 µm. In particular, the structures separate various such regions from one another such that said regions do not influence one another during a subsequent magnetization step. To this end, use may be made, in particular, of trenches through the aforementioned layers, said trenches defining the regions.

At 11, the regions defined thus are magnetized, for example by means of laser magnetization, wherein different regions may obtain different magnetizations, but the magnetization within each region is substantially homogeneous. Since the structures which define the regions are relatively large, it is possible to achieve a high magnetization of the regions; in later example embodiments, this leads to a correspondingly high capability, for example comparatively high signals, of the resultant apparatus.

At 12, structures are then formed within the regions in order to form individual magnetoresistive elements, for example individual sensor elements. These structures may be substantially smaller than the structures formed at 10, for example having dimensions of less than 5 µm, less than 1 µm, or even smaller, with larger dimensions also being possible. Since the magnetization already took place (at 11), such small structure dimensions do not adversely affect the magnetization, in contrast to conventional procedures, in which small structures are magnetized, e.g. by means of laser magnetization or by means of spatially restricted magnetic fields.

FIG. 2 depicts a block diagram of an apparatus in accordance with an embodiment, by means of which the method of FIG. 1 may be implemented. Here, FIG. 2 shows a first structuring apparatus 20, a magnetization apparatus 21, and a second structuring apparatus 22. A substrate to be processed passes through these apparatuses in order. As also already explained for the method of FIG. 1, further apparatuses may be disposed upstream and/or downstream of the illustrated apparatuses for the purposes of carrying out further processing steps.

Here, in accordance with the explanations in relation to 10 in FIG. 1, the first structuring apparatus is configured to form structures for defining regions in substrates, which regions are intended to obtain the same magnetization. To this end, the first structuring apparatus may comprise conventional apparatuses, e.g. etching apparatuses, lithography apparatuses (e.g. photolithography or electron beam lithography, depending on structure dimensions), e.g. lithography apparatuses which make use of masks, depositing apparatuses for depositing layers, and the like.

Substrates structured thus, e.g. semiconductor wafers, are then supplied to the magnetization apparatus 21 for magnetizing the regions. Here, in particular, the magnetization apparatus 21 may comprise a laser magnetization apparatus. Then, the substrate with the regions magnetized thus is supplied to the second structuring apparatus 22 for the purposes of forming relatively small structures within the regions in order to define magnetoresistive elements, e.g. sensor elements. Similar to the first structuring apparatus 20, the second structuring apparatus 22 may also comprise conventional elements such as the photolithography apparatuses, depositing apparatuses, etching apparatuses and the like, wherein these may be designed for smaller structures than the corresponding apparatuses of the first structuring apparatus. However, the first structuring apparatus 20 and the second structuring apparatus 22 may also use common apparatuses, devices and the like, for example lithography apparatuses or etching apparatuses, wherein different structures are formed. The illustration as two blocks 20, 22 should therefore be understood to be a functional illustration and this does not necessarily mean a spatial separation.

For the purposes of more detailed explanations in respect of the method in FIG. 1 and the apparatus in FIG. 2, explanations are now provided on the basis of schematically illustrated example structures, with reference being made to FIGS. 3A-B, 4A-B, 5A-B, 6A-B, 7, 8A-B and 9A-B. Here, FIGS. 3A-B, 4A-B, 5A-B, 6A-B, 8A-B and 9A-B, which may be referred to as FIGS. 3-6, 8 and 9, respectively, each show a plan view (the Figure denoted by "A" in each case) and a cross-sectional view (denoted by "B" in each case) of the structures in various states of processing, for example, by means of the method illustrated in FIG. 1 or the apparatus shown in FIG. 2. These structures merely serve for exemplification, and the precise type or form of the structures may differ, depending on the magnetoresistive apparatus to be produced.

FIGS. 3A and 3B show an example for an initial state before depositing or otherwise forming magnetic layers for forming magnetoresistive elements in accordance with one or more embodiments. In the cross-sectional view of FIG. 3B, it is possible to see the uppermost two layers of a substrate which has already been processed here. Reference sign 30 is used to denote a metal layer which, for example, serves to connect and contact structures lying therebelow (said structures not being illustrated but only being indicated by dots), said structures forming electronic components, and to connect the latter with the magnetoresistive elements discussed in the following. In other embodiments, the metal layer 30 may also be deposited directly on a raw substrate. By way of example, a silicon wafer or any other semiconductor wafer may serve as a substrate, in which, as mentioned above, components may, but need not, have been formed.

Reference sign 31 denotes a dielectric layer, for example made of silicon dioxide or silicon nitride. As may also be identified in the plan view of FIG. 3A, the dielectric layer 31 has vias ("vertical interconnect accesses") 32 at various points. By means of the vias 32, which may consist of a metal or any other electrically conductive material, magnetoresistive structures formed in the following are electrically connected to the metal layer 30 (and hence, optionally, to components formed in a substrate). In other embodiments, the vias 32 and the metal layer 30 may also be omitted, and a metal layer or other electrical contacting may be provided above the layers described below for the purposes of forming xMR elements. Even though a single metal layer 30 has been depicted, a plurality of metal layers may also be provided, as is conventional, for example, when producing semiconductor components.

Figure 4B:
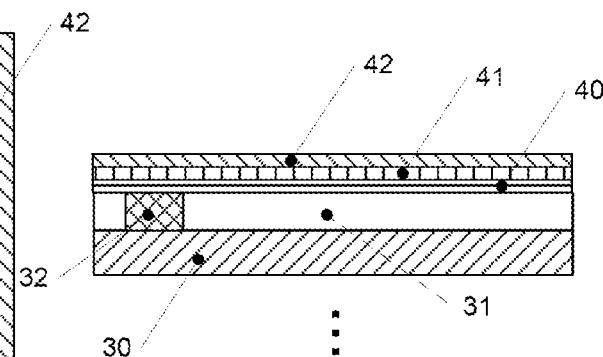
Figure 5A:
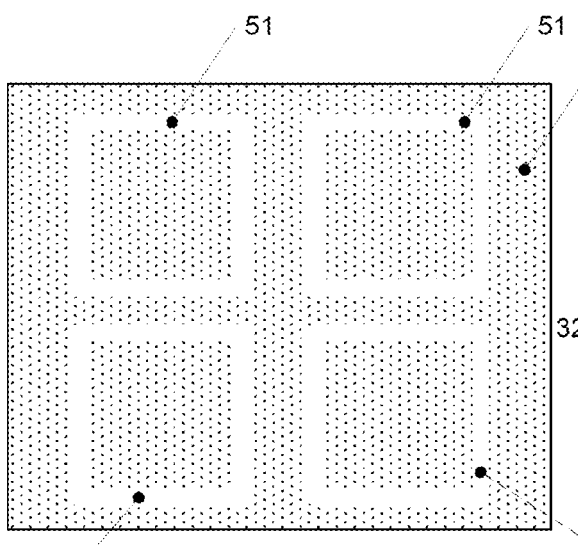
FIGS. 5A-5B are schematic views of structures for exemplifying at least part of the method of FIG. 1 and the method of operation of the apparatus of FIG. 2.
Figure 5B:
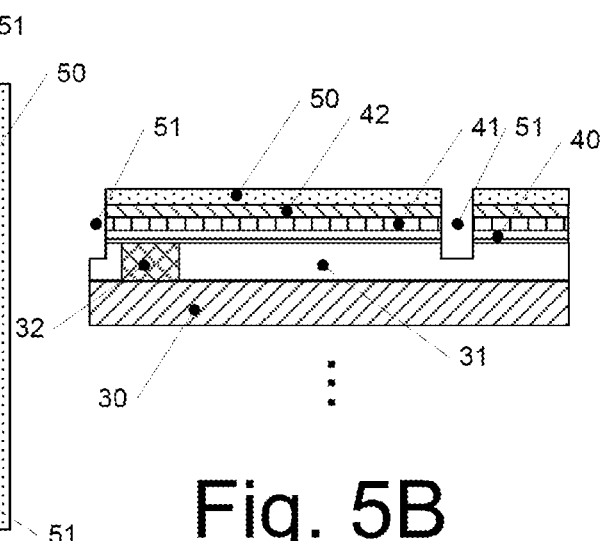

Next, magnetic layers for forming xMR elements, for example TMR elements, are deposited on the layers depicted in FIGS. 3A and 3B. This is depicted in FIGS. 4A and 4B. In the example of FIGS. 4A and 4B, a first magnetic layer 40, which subsequently serves as reference layer, a spacer layer 41, for example made of electrically conductive or nonconductive nonmagnetic material, and a third layer 42, which consists of magnetic material and subsequently serves as a free layer for magnetoresistive elements, are deposited or formed in any other way. Depending on the magnetoresistive structures to be formed, it is also possible to deposit more than three layers or fewer than three layers. Examples of possible materials were already explained further above.

Next, as explained in relation to 10 in FIG. 1, structures for defining regions of the same magnetization are formed. To this end, a mask 50 is arranged on the arrangement of FIGS. 4A and 4B, wherein the mask may be formed by depositing material on the structure or positioned on the layer stack (40-42) as a separate mask, for example as a hard mask or soft mask. Gaps in the mask facilitate an etching of trenches 51. In the illustrated example, the trenches 51 surround a group of six vias (see FIG. 3A) in each case and enclose regions which should subsequently obtain a magnetization which is the same within the region, with the magnetization being able to differ from region to region. In particular, the trenches 51 pass through the layer 40, which subsequently serve as a reference layer.

Thus, the processes explained above develop structures which define regions of the same magnetization. Here, the procedure explained above merely serves as an example, and other procedures are also possible here. By way of example, webs made of dielectric material may be formed at the locations of the trenches 51 of FIG. 5 on, e.g., the structure of FIG. 3 in another embodiment. By way of example, this may be carried out by depositing a dielectric layer with subsequent structuring of same by way of conventional methods. Thereupon, the layers for forming the magnetoresistive elements (e.g. corresponding to layers 40-42 in FIG. 4) are deposited between the webs formed thus, for example by way of a corresponding mask or by depositing the layers and subsequently removing the material deposited on the webs. Regions which are separated from one another (by way of the webs) are formed in this way.

Figures 6A, 6B:
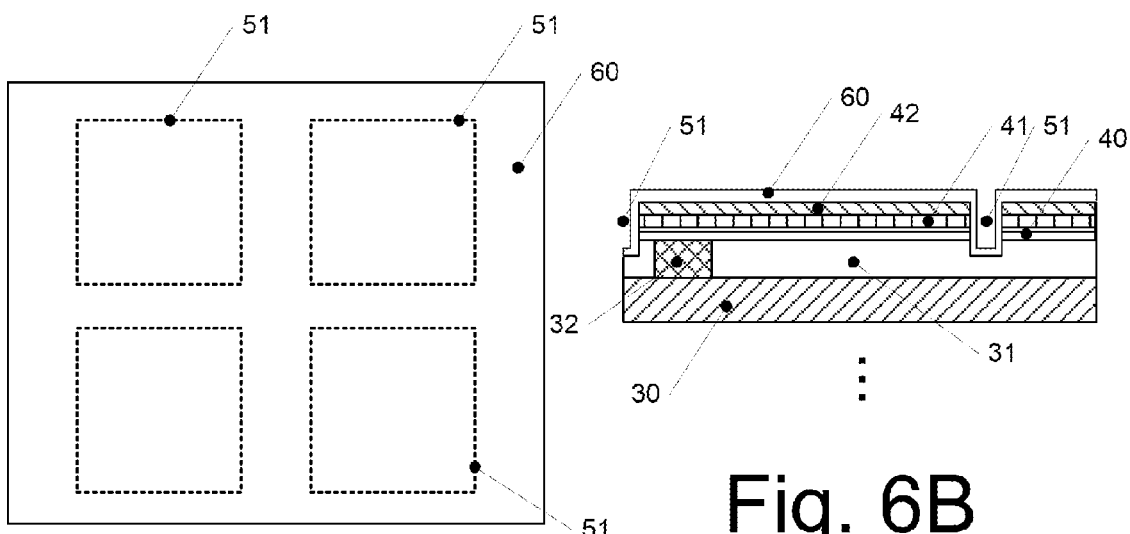
FIGS. 6A-6B are schematic views of structures for exemplifying at least part of the method of FIG. 1 and the method of operation of the apparatus of FIG. 2.

Then, as shown in FIGS. 6A and 6B, a passivation 60, for example made of silicon dioxide or another dielectric material, may optionally be applied to the layer stack 40-42 prior to the actual magnetization.

Figure 7:
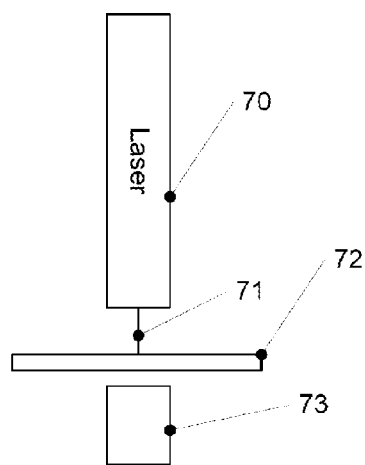
FIG. 7 is a schematic illustration for exemplifying a laser magnetization.
Figures 8A, 8B:
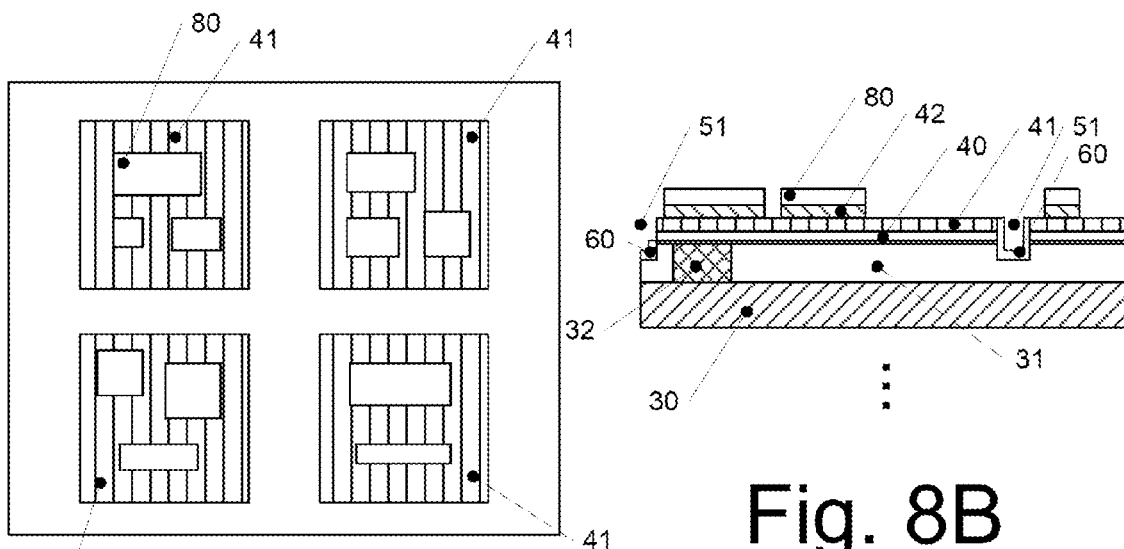
FIGS. 8A-8B are schematic views of structures for exemplifying at least part of the method of FIG. 1 and the method of operation of the apparatus of FIG. 2.
Figures 9A, 9B:
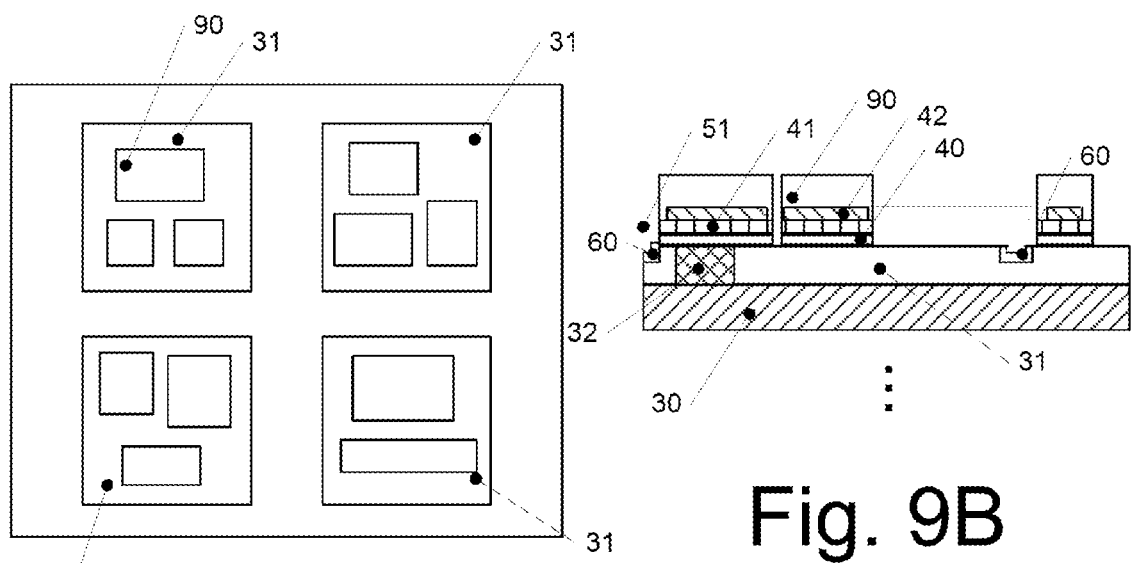
FIGS. 9A-9B are schematic views of structures for exemplifying at least part of the method of FIG. 1 and the method of operation of the apparatus of FIG. 2.

Next, magnetization of the regions 51 is carried out in accordance with reference sign 11 in FIG. 1. Here, in the depicted example, each of the regions 51 may obtain a different magnetization (i.e. a different magnetization direction) or different regions may obtain the same magnetization, depending on the magnetoresistive elements to be produced. Here, in particular, the magnetization may be brought about by means of a laser magnetization, as is illustrated schematically in FIG. 7. In FIG. 7, regions of a substrate 72 to be magnetized (for example of the substrate with layers as indicated in FIGS. 6A and 6B provided thereon) are irradiated by a laser beam 71 emitted by a laser 70 in the presence of a magnetic field produced by magnet 73, and hence said regions are heated. The magnet 73 may be a permanent magnet, an electromagnet or a combination thereof. Different magnetizations may be produced in different regions by changing the alignment of the magnet 73 from region to region. As a result of the regions being separated by the trenches 51, a magnetization of one region does not have a substantial effect on another region, and so the regions may be magnetized separately from one another. However, other magnetization methods may also be carried out, e.g. a magnetization by means of spatially tightly restricted magnetic fields and heating of the entire substrate.

Second structuring (as explained with reference to 12 in FIG. 1), which is illustrated in FIGS. 8 and 9 as an example, occurs after the laser magnetization. The structuring of FIG. 8 uses a mask 80 (for example, in turn, a hard mask) in order to remove parts of the layer 42, for example by etching. As a result of this, individual regions of the magnetoresistive layer 42 are removed. In FIG. 9, there is a further structuring step, in which the layers 40 and 41 are also separated and a passivation layer 90 is deposited, as illustrated. To this end, it is possible, once again, to use masks, etching processes or other conventional lithography steps. As is possible to identify, the structures formed in FIGS. 8 and 9 are smaller than the regions which are defined in FIG. 5B. Since the magnetization already occurred on the basis of the larger regions, the small structure dimensions, which are worked out in the FIGS. 8 and 9, do not have a disadvantageous effect on the magnetization.

Illustrated structures (FIGS. 3-6, 8, 9) should be understood merely as example. In particular, other forms of structures may also be formed in addition to rectangular structures, the forms and dimensions of the structures may deviate from what is illustrated, and additional structures such as adjustment marks, etc. may be present. As already explained above, the depicted structures merely serve for an improved understanding of the method.

It is therefore possible, in the manner illustrated above, to produce xMR apparatuses with small structures and a good magnetization, with mutually independent magnetizations in various regions. The precise procedure may differ, depending on the type of xMR apparatus to be produced. Further structuring steps may also follow. By way of example, when producing a TMR angle sensor with four different magnetization directions in a reference layer, it is possible to carry out the structuring of the regions (step 10) first, followed by a laser magnetization (step 11 in FIG. 1) and then a structuring of an upper electrode, followed by a structuring of a lower electrode (both e.g. in step 12 of FIG. 1).

A similar procedure may be carried out in the case of the TMR angle sensor with more than four different magnetization directions, which may be helpful, for example, for canceling higher harmonics contributions (harmonic waves) during the measurement.

In the case of an xMR (e.g. TMR or GMR) angle sensor with four different magnetization directions, there may likewise initially be structuring of the regions (step 10), followed by a laser magnetization (11), with these then being able to be followed by a structuring of the xMR (e.g. TMR or GMR) layer stack.

An xMR (e.g. GMR or TMR) speed sensor may also be produced in a similar fashion, said xMR speed sensor using differently magnetized xMR resistors in order to develop a sensor bridge which is less sensitive to inclinations. In principle, the illustrated techniques may be used, in general, if locally different magnetizations should be produced, in particular if small structure dimensions are required.

Here, the aforementioned exemplary embodiments should only be considered to be non-restrictive examples.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. An apparatus for producing a magnetoresistive apparatus, comprising:
    a first structuring apparatus configured to define regions in a substrate;
    a magnetizing apparatus configured to magnetize at least one layer in each of the defined regions with one of a plurality of magnetizations, wherein a magnetization in each defined region is the same throughout that defined region; and
    a second structuring apparatus configured to form a plurality of magnetoresistive structures within each of the defined regions subsequent to the magnetizing apparatus magnetizing the at least one layer in each of the defined regions with one of the plurality of magnetizations, wherein the second structuring apparatus is configured to form the plurality of magnetoresistive structures within each of the defined regions by further structuring the substrate within each of the defined regions such that at least a portion of the substrate is removed to define the plurality of magnetoresistive structures as separate structures.

2. The apparatus as in claim 1, wherein the plurality of magnetoresistive structures are magnetoresistive sensor elements.

3. The apparatus as in claim 2, further comprising:
    a depositing apparatus configured to deposit a passivation layer on each of the plurality of magnetoresistive structures to separably encapsulate each of the plurality of magnetoresistive structures.

4. The apparatus as in claim 1, wherein the plurality of magnetoresistive structures formed within each of the defined regions have a smallest dimension of less than 5 µm.

5. The apparatus as in claim 1, wherein the defined regions have a smallest dimension of greater than 10 µm.

6. The apparatus as in claim 1, wherein each of the defined regions comprises a magnetoresistive layer stack.

7. The apparatus as in claim 6, wherein the defined regions are separated from each other by trenches.

8. The apparatus as in claim 7, wherein each trench extends into the substrate and encircles one of the defined regions.

9. The apparatus as in claim 1, wherein the magnetizing apparatus is configured to magnetize the at least one layer in each of the defined regions such that at least two of the defined regions are magnetized with mutually different magnetizations.

10. The apparatus as in claim 1, wherein the magnetizing apparatus is configured to magnetize a reference layer in each of the defined regions.

11. The apparatus as in claim 1, wherein the magnetizing apparatus is configured to magnetize the at least one layer in each of the defined regions using laser magnetizing.

12. The apparatus as in claim 1, wherein each of the plurality of magnetoresistive structures within each of the defined regions is a discrete magnetoresistive sensor element.

13. The apparatus as in claim 1, wherein:
    the substrate includes a magnetoresistive layer stack including a reference layer as the at least one layer and a free layer, and
    the first structuring apparatus is configured to structure the substrate with the defined regions by forming a plurality of trenches that extend entirely through the magnetoresistive layer stack, wherein each of the plurality of trenches defines one of the defined regions.

14. The apparatus as in claim 13, wherein the second structuring apparatus is configured to remove portions of the reference layer and the free layer within each of the defined regions in order to define the plurality of magnetoresistive structures as separate structures.

15. The apparatus as in claim 13, wherein each of the plurality of trenches encircles one of the defined regions.

* * * * *